United States Patent [19]

Masuda

[11] 4,045,686
[45] Aug. 30, 1977

[54] VOLTAGE COMPARATOR CIRCUIT
[75] Inventor: Kenzo Masuda, Tokorozawa, Japan
[73] Assignee: Hitachi, Ltd., Japan
[21] Appl. No.: 634,773
[22] Filed: Nov. 24, 1975
[30] Foreign Application Priority Data
  Nov. 25, 1974  Japan .................................. 49-134297
[51] Int. Cl.² ............................................ H03K 5/20
[52] U.S. Cl. .................................... 307/355; 307/279; 328/127; 328/146
[58] Field of Search ......... 307/235 F, 235 H, DIG. 3, 307/291, 279; 328/127, 146–149

[56] References Cited
U.S. PATENT DOCUMENTS
3,727,143  4/1973  Garrett ............................ 307/235 H OTHER PUBLICATIONS
IBM Technical Disclosure Bulletin, vol. 16, No. 3, Aug. 1973, pp. 992–993 Cross-Coupled True and Complement Powering Circuit by J. M. Lee et al.

Primary Examiner—John Zazworsky
Attorney, Agent, or Firm—Craig & Antonelli

[57] ABSTRACT

A voltage comparator circuit suitable for a semiconductor integrated circuit device comprises a pair of time constant circuits each of which includes a variable impedance, such as a depletion type MISFET, and a capacitor, the variable impedance being controlled by input voltages which are to be compared with one another and a flip-flop circuit which is stabilized to predetermined values on the basis of the comparison between the time variations of the outputs of the time constant circuits.

12 Claims, 3 Drawing Figures

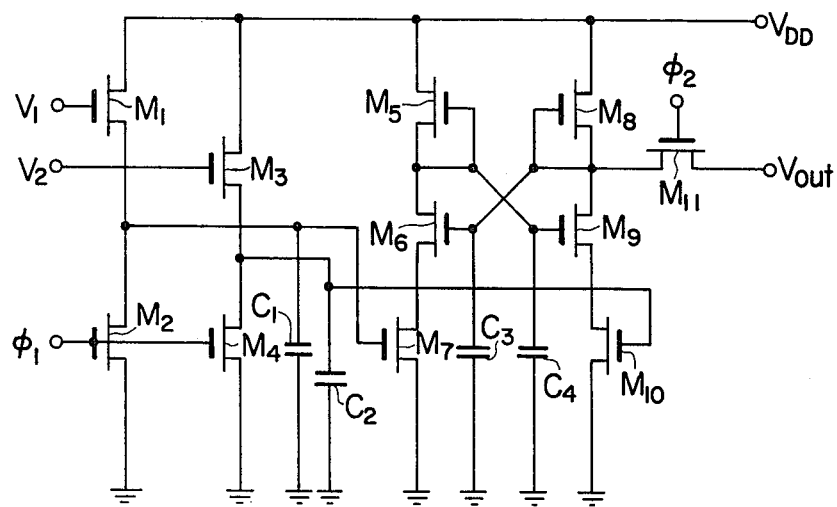
FIG. 1
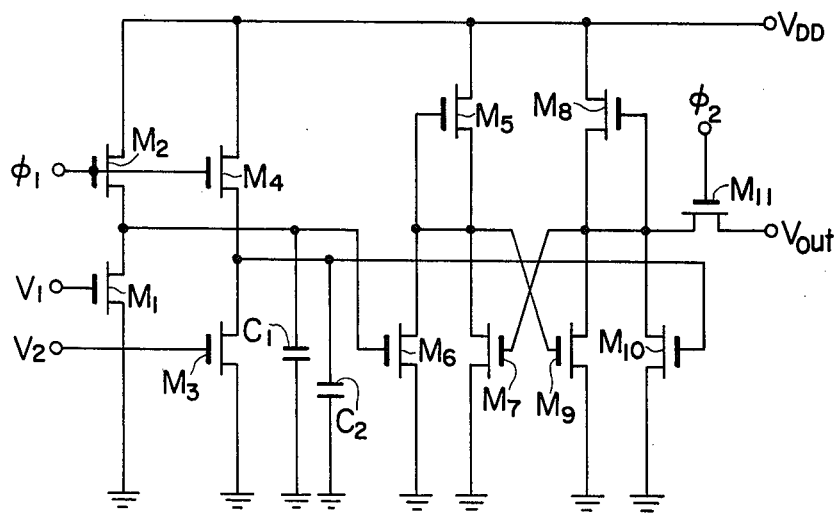
FIG. 2
FIG. 3
PRIOR ART
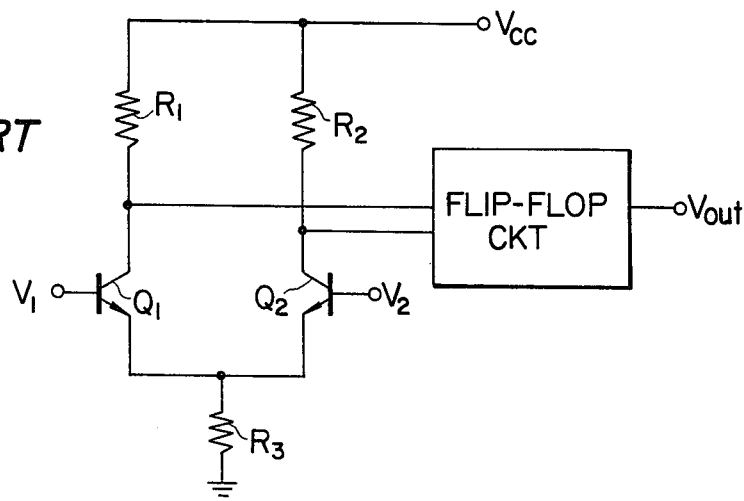

VOLTAGE COMPARATOR CIRCUIT

FIELD OF THE INVENTION

This invention relates to a voltage comparator circuit, and, more particularly, to a voltage comparator circuit which employs insulated gate-effect transistors (MISFETs which shall be simply termed FETs hereinbelow).

BRIEF DESCRIPTION OF THE DRAWING

FIGS. 1 and 2 are circuit diagrams each of which shows an embodiment of the voltage comparator circuit according to this invention, and FIG. 3 is a circuit diagram which shows an example of a prior-art voltage comparator circuit.

DESCRIPTION OF THE PRIOR ART

FIG. 3 illustrates a conventional circuit for comparing two voltages and detecting the difference between them.

In this circuit, a differential amplifier circuit is constructed of resistances $R_1$ to $R_3$ and bipolar transistors $Q_1$ and $Q_2$. Input voltages $V_1$ and $V_2$ are respectively applied to the bases of the transistors $Q_1$ and $Q_2$, and the inverted output of a flip-flop circuit FF connected at the succeeding stage represents the level difference between the inputs.

It is a recent technological trend that most electronic circuits are constructed of semiconductor integrated circuits. Where a voltage comparator circuit is formed as a semiconductor integrated circuit, the employment of FETs is more advantageous than that of bipolar transistors from the viewpoint of the enhancement of the density of integration.

However, where a differential amplifier circuit and an output circuit to be connected thereto (for example, a flip-flop circuit) are made up of FETs, various problems arise.

Since a threshold voltage $V_{th}$ is necessary for the input FET of the output circuit to operate, the output of the differential amplifier circuit must be at a voltage greater than the value $V_{th}$. On the other hand, in order to attain a high operating sensitivity for the differential amplifier circuit, the transfer conductance $(g_m)$ of the FET as the amplifier element must be considerably large. In order to make the value $g_m$ large, the area of this FET must generally be made large.

These problems are attributed to the fact that the difference between the compared voltages is directly applied to the detector circuit.

SUMMARY OF THE INVENTION

The present invention has been developed in order to solve these problems, and has as an object the provision of a voltage comparator circuit which is suitable for a semiconductor integrated circuit device.

A fundamental construction of this invention for accomplishing this object is characterized by at least a pair of time constant circuits each of which includes a variable impedance and a capacitor, the variable impedance being controlled by an input voltage, and a flip-flop circuit which is stabilized to predetermined values by comparisons of time variations of the outputs of the time constant circuits.

Another construction of this invention is characterized by at least a pair of integration circuits each of which includes a variable impedance and a capacitor, the variable impedance being controlled by an input voltage, a pair of switching means each of which is driven by a clock pulse, and a pair of logic circuits each of which has two driving elements connected in series with a load element, the pair of switching means being respectively connected across the terminals of said capacitors, the pair of logic circuits constituting a flip-flop circuit in such a manner that the output of one of the corresponding two driving elements of the logic circuits is applied to the input of the other of said corresponding driving elements and that the output voltages of the integration circuits are respectively applied to the inputs of the remaining two corresponding driving elements of the logic circuits, an output of said voltage comparator circuit being derived from the flip-flop circuit, the switching elements being held conductive by the clock pulse during a period of time during which no voltage comparison is made.

Still another construction of this invention is characterized by at least a pair of differentiation circuits each of which includes a variable impedance and a capacitor, the variable impedance being controlled by an input voltage, a pair of switching devices each of which is driven by a clock pulse, and a pair of logic circuits each of which has two driving elements connected in parallel with a load element, a supply voltage being applied to the differentiation circuits through the switching devices, the pair of logic circuits constituting a flip-flop circuit in such manner that the output of each of the logic circuits is applied to the input of one of the driving elements of the opposite logic circuit and that the output voltages of the differentiation circuits are respectively applied to the inputs of the remaining driving elements of the logic circuits, the output of said voltage comparator circuit being derived from the flip-flop circuit, the switching devices being held conductive by the clock pulse during a period of time during which no voltage comparison is made.

DETAILED DESCRIPTION OF THE INVENTION

With reference to FIG. 1, between a power supply terminal $V_{DD}$ and ground, an FET $M_1$ as a variable impedance and an FET $M_2$ as a switching element are connected in series. An input $V_1$ is applied to the gate of the FET $M_1$, while a clock pulse $\phi_1$ is applied to the gate of the FET $M_2$. Also, between the power supply terminal $V_{DD}$ and ground, an FET $M_3$ as a variable impedance and an FET $M_4$ as a switching element are connected in series. An input $V_2$ is applied to the gate of the FET $M_3$, while the clock pulse $\phi_1$ is applied to the gate of the FET $M_4$.

Further, a load FET $M_5$ and switching FETs $M_6$ and $M_7$ are connected in series between the power supply terminal $V_{DD}$ and ground. The source and gate of the FET $M_5$ are short-circuited. Thus, a first 2-input logical circuit is constructed. Likewise, a second 2-input logical circuit is constructed which is made up of a load FET $M_8$ and switching FETs $M_9$ and $M_{10}$.

The gates of the corresponding switching FETs $M_6$ and $M_9$ of the two 2-input logic circuits are connected at the outputs of opposite logic circuits, respectively. The gates of the other corresponding switching FETs $M_7$ and $M_{10}$ are connected with the sources of the variable impedance FETs $M_1$ and $M_3$, respectively. Thus, a flip-flop circuit is formed.

An FET $M_{11}$ which is driven by a clock pulse $\phi_2$ is connected to an output of the flip-flop circuit. An output terminal $V_{out}$ is connected to the source of the FET $M_{11}$.

Capacitors $C_1$ to $C_4$ are the gate capacitances of the FETs, and the FETs $M_1, M_3$ and $M_5, M_8$ are of the depletion type.

OPERATION

Initially, in response to the application the clock pulse $\phi_1$ to FETs $M_2$ and $M_4$ the capacitors $C_1$ and $C_2$ are discharged. Due to the discharge, the FETs $M_7$ and $M_{10}$ constituting the flip flop circuit become nonconductive, and the capacitors $C_3$ and $C_4$ commence charging. Due to the charging of the capacitors $C_3$ and $C_4$, FETs $M_6$ and $M_9$ become conductive.

Subsequently, when the clock pulse $\phi_1$ is no longer applied and, simultaneously, input voltages $V_1$ and $V_2$ are applied, the capacitors $C_1$ and $C_2$ are charged through FETs $M_1$ and $M_3$ whose impedances are determined in dependence on the levels of the input voltages $V_1$ and $V_2$, respectively.

As a consequence, when, by way of example, $V_1 > V_2$, the impedance of the FET $M_1$ becomes lower than that of the FET $M_3$, and the charge on capacitor $C_1$ increases faster than that of capacitor $C_2$. Since the charged voltages of the respective capacitors are supplied to the gates of the FETs $M_7$ and $M_{10}$ constituting the flip-flop, the FET $M_7$ whose threshold voltage is reached earlier is rendered conductive first. Due to the conduction of the FET $M_7$, capacitor $C_4$ is discharged, and the FET $M_9$ becomes nonconductive. Accordingly, the output of the flip-flop circuit becomes that of the supply voltage $V_{DD}$. Even when the FET $M_{10}$ becomes conductive when FET $M_7$ is conductive, the $V_{DD}$ level on the output remains unchanged because FET $M_9$ is nonconductive.

When, conversely to the above situation, the two inputs have a relation of $V_1 < V_2$, ground potential is produced at the output of the flip-flop.

In this way, a voltage comparison is carried out.

The clock pulse $\phi_2$ is impressed on the gate of the FET $M_{11}$ since an output is acquired in conformity with the period of time during which the result of the voltage comparison is to be detected. The clock pulse $\phi_1$ serves to continuously effect a voltage comparison, and is applied in order to carry out the preparatory operation for the voltage comparison.

As is set forth above, the invention effects a voltage comparison in such a manner that the voltages to be compared are applied to variable impedances causing variations in currents, to charge the capacitors $C_1$ and $C_2$, and that the flip-flop circuit is operated in dependence on the difference between the charging periods of time. The invention is therefore advantageous in that the transfer conductance ($g_m$) need not be considered. Another advantage is that, by using depletion type FETs for the FETs $M_1$ and $M_3$ as variable impedances the comparator can be utilized even when the voltages $V_1$ and $V_2$ to be compared are below the threshold voltages $V_{th}$ of the FETs.

The invention is not restricted to the above embodiment.

For example, although in the foregoing embodiment the difference between the charging periods of time of the capacitors $C_1$ and $C_2$ is detected on the basis of the difference between the input voltages $V_1$ and $V_2$ applied to the FETs $M_1$ and $M_3$ functioning as variable impedances, the difference between the discharging periods of time of the capacitors $C_1$ and $C_2$ may be detected as illustrated in FIG. 2. This circuit arrangement differs from that of FIG. 1.

As is illustrated in FIG. 2, FETs $M_1$ and $M_3$ forming the impedances which are controlled by the input voltages $V_1$ and $V_2$ are provided on the ground terminal side, and the FETs $M_2$ and $M_4$ which are driven by the clock pulse are provided on the power supply terminal $V_{DD}$ side. Further, the switching FETs $M_6$ and $M_7$ are connected in parallel and they are connected to the load FET $M_5$, to thus construct a first 2-input logic circuit. Similarly, a second 2-input logic circuit is constructed which is composed of the load FET $M_8$ and the switching FETs $M_9$ and $M_{10}$. The first and second logic circuits constitute a flip-flop circuit in such a way that the gates of the switching FETs $M_7$ and $M_9$ are connected with the outputs of the opposite logic circuits, respectively, and that the gates of the remaining switching FETs $M_6$ and $M_{10}$ are connected with the drains of the variable impedance FETs $M_1$ and $M_3$, respectively.

Here, the capacitors $C_1$ and $C_2$ are formed by the gate capacitances of the FETs. The FET $M_{11}$ which is driven by the clock pulse $\phi_2$ is the same as explained in the embodiment of FIG. 1.

Initially, upon application of the clock pulse $\phi_1$ to FETs $M_2$ and $M_4$ capacitors $C_1$ and $C_2$ are charged, with the result that the FETs $M_6$ and $M_{10}$ being the inputs of the flip-flop circuit, becomes conductive. Subsequently, when the clock pulse $\phi_1$ is not applied and the inputs $V_1$ and $V_2$ are applied, the impedances of the FETs $M_1$ and $M_3$ are determined by the inputs and the capacitors $C_1$ and $C_2$ are discharged in conformity with the different impedances, respectively. Due to the difference between the discharging periods of time, either of the FETs $M_6$ and $M_{10}$, being the inputs of the flip-flop circuit, is rendered nonconductive. Thus, the output of the flip-flop circuit is determined, and a voltage comparison is carried out.

With the above circuit, if the clock pulse $\phi_1$ is applied when $V_1$ and $V_2$ are applied, the charging levels of the capacitors $C_1$ and $C_2$ will be respectively determined by the impedance ratios between the FETs $M_1$ and $M_2$ and between the FETs $M_3$ and $M_4$ and, hence, the discharging will provide the nonconductive level of the FET in a very short time. This brings forth the advantages that the operating sensitivity is very satisfactory.

Although, in the embodiments of FIGS. 1 and 2, the gate capacitances of the FETs are employed as the capacitors, this is not restrictive but externally-mounted capacitors may be used.

This invention can be extensively utilized for a voltage comparator employing FETs.

I claim:

1. A voltage comparator circuit comprising:
   a pair of time constant circuits each of which includes variable impedance means and a capacitor, each of said variable impedance means being controlled by a respective input voltage,
   a flip-flop circuit which is stabilized to predetermined values by comparisons of time variations of outputs of said time constant circuits, said flip-flop circuit including first and second inputs, each connected to a respective one of the pair of time constant circuits, and
   clock control means for enabling said flip-flop circuit to respond to the output of each time constant circuit in synchronism with a clock pulse.

2. A voltage comparator circuit according to claim 1, wherein said flip-flop circuit comprises a plurality of MISFETs and said capacitors are the input stray capacitances of said flip-flop circuit.

3. A voltage comparator circuit according to claim 1, wherein said clock control means operates in synchronism with a first clock pulse, and further including additional clock control means for deriving the output representing the compared result from said flip-flop circuit in synchronism with a second clock pulse having a different phase from said first clock pulse.

4. A voltage comparator circuit comprising:
a pair of integration circuits each of which includes variable impedance means and a capacitor, said variable impedance means being controlled by an input voltage,
a pair of switching means each of which is driven by a clock pulse, said pair of switching means being respectively connected across terminals of said capacitors, and
a pair of logic circuits each of which has two driving elements connected in series with a load element, said pair of logic circuits constituting a flip-flop circuit in such a manner that an output of one of the corresponding two driving elements of said logic circuits is applied to an input of the other of said corresponding driving elements and that output voltages of said integration circuits are respectively applied to inputs of the remaining corresponding two driving elements of said logic circuits, an output of said voltage comparator circuit being derived from said flip-flop circuit,
and wherein said switching elements being held conductive by said clock pulse during a period during which no voltage comparison is made.

5. A voltage comparator circuit comprising:
a pair of differentiation circuits each of which includes variable impedance means and a capacitor, said variable impedance means being controlled by an input voltage,
a pair of switching means each of which is driven by a clock pulse, and
a pair of logic circuits each of which has two driving elements connected in series with a load element,
a supply voltage being applied to said differentiation circuits through said switching means,
said pair of logical circuits constituting a flip-flop circuit in such a manner that an output of each of said logic circuits is applied to an input of one of said driving elements of the opposite logic circuit and that output voltages of said differentiation circuits are respectively applied to inputs of the remaining driving elements of said logic circuits, an output of said voltage comparator circuit being derived from said flip-flop circuit,
said switching elements being held conductive by said clock pulse during a period during which no voltage comparison is made.

6. A voltage comparator circuit comprising:
first and second input terminals to which first and second voltages to be compared with one another are respectively applied;
first and second integration circuits each including a controlled impedance element and a storage element connected in series between first and second sources of reference potential, said controlled impedance element having a control terminal connected to a respective one of said first and second input terminals, and a controlled switching element coupled between the storage element and one of said first and second sources of reference potential for controllably presetting the amount of energy stored by said storage element, the time constants of said first and second integration circuits being proportional to the respective magnitudes of said first and second voltages; and
a flip-flop circuit having first and second inputs respectively coupled to said first and second integration circuits and an output terminal which provides an output voltage representative of which of said first and second voltages has the larger magnitude.

7. A voltage comparator circuit according to claim 6, wherein each storage element comprises a capacitor and each controlled impedance element comprises a field effect transistor the gate electrode of which is the control terminal thereof.

8. A voltage comparator circuit according to claim 7, wherein each controlled switching element comprises a field effect switching transistor connected to the same one of said first and second sources of reference potential to which said capacitor is connected.

9. A voltage comparator circuit comprising
first and second input terminals to which first and second voltages to be compared with one another are respectively applied;
first and second integration circuits each including a controlled impedance element and a storage element connected in parallel, said controlled impedance element having a control terminal connected to a respective one of said first and second input terminals, the time constants of said first and second integration circuits being proportional to the respective magnitudes of said first and second voltages; and
a flip-flop circuit having first and second inputs respectively coupled to said first and second integration circuits and an output terminal which provides an output voltage representative of which of said first and second voltages has the larger magnitude.

10. A voltage comparator circuit according to claim 9, wherein the parallel-connected integrator circuit elements are connected at one end to one of first and second sources of reference potential, and each of said integration circuits further comprises a controlled switching element coupled between the storage element and the other of said first and second sources of reference potential for controllably pre-setting the amount of energy stored by said storage element.

11. A voltage comparator circuit according to claim 10, wherein each storage element comprises a capacitor, and each controlled impedance element comprises a field effect transistor the gate electrode of which is the control terminal thereof.

12. A voltage comparator circuit according to claim 11, wherein each controlled switching element comprises a field effect switching transistor.

* * * * *